(12) United States Patent
Okada et al.

(10) Patent No.: US 12,178,000 B2
(45) Date of Patent: Dec. 24, 2024

(54) ELECTRIC COMPRESSOR

(71) Applicant: KABUSHIKI KAISHA TOYOTA JIDOSHOKKI, Kariya (JP)

(72) Inventors: Satoshi Okada, Aichi-ken (JP); Katsuya Usami, Aichi-ken (JP); Yoshifumi Tada, Aichi-ken (JP); Yuta Wato, Aichi-ken (JP)

(73) Assignee: KABUSHIKI KAISHA TOYOTA JIDOSHOKKI, Kariya (JP)

( * ) Notice: Subject to any disclaimer, the term of this patent is extended or adjusted under 35 U.S.C. 154(b) by 176 days.

(21) Appl. No.: 17/696,436

(22) Filed: Mar. 16, 2022

(65) Prior Publication Data

US 2022/0304178 A1    Sep. 22, 2022

(30) Foreign Application Priority Data

Mar. 19, 2021    (JP) ................. 2021-045477

(51) Int. Cl.
| | |
|---|---|
| H05K 7/14 | (2006.01) |
| H02K 7/18 | (2006.01) |
| H02K 11/30 | (2016.01) |
| H05K 1/02 | (2006.01) |

(52) U.S. Cl.
CPC ............ H05K 7/1417 (2013.01); H02K 7/18 (2013.01); H02K 11/30 (2016.01); H05K 1/0216 (2013.01); H05K 7/1432 (2013.01)

(58) Field of Classification Search
CPC ...... F04D 13/0686; H02K 7/18; H02K 11/30; H05K 7/1432; H05K 1/0216; H05K 7/1417; H05K 1/0271; H05K 2201/09036; H05K 2201/09063; H05K 2201/09072; H05K 2201/09081; H05K 2201/09163; H05K 2201/10409

See application file for complete search history.

(56) References Cited

U.S. PATENT DOCUMENTS

2013/0293047 A1*  11/2013  Nagasaka .............. H02K 11/05
                                                              310/72
2014/0037470 A1    2/2014  Kinoshita et al.

FOREIGN PATENT DOCUMENTS

| JP | 2013219229 A | * | 10/2013 | |
|---|---|---|---|---|
| JP | 2014-31771 A | | 2/2014 | |
| JP | 2020-70739 A | | 5/2020 | |
| JP | 2020122426 A | * | 8/2020 | .............. F04B 35/04 |

* cited by examiner

*Primary Examiner* — Philip E Stimpert
(74) *Attorney, Agent, or Firm* — Sughrue Mion, PLLC

(57) ABSTRACT

An electric compressor includes an inverter portion that includes a circuit board, a busbar fixed to the inverter housing and connecting an external power supply to the circuit board, a noise reduction circuit mounted on the circuit board, a first fastener fastening the circuit board to the inverter housing, and a second fastener fastening the busbar to the circuit board. The circuit board includes a first fastening hole through which the first fastener is inserted, a second fastening hole that is disposed adjacent to the first fastening hole and through which the second fastener is inserted, and a slit extending between the first fastening hole and the second fastening hole from a peripheral edge of the circuit board. The first fastener electrically connects the circuit board as a ground of the noise reduction circuit to the inverter housing.

4 Claims, 5 Drawing Sheets

ELECTRIC COMPRESSOR

CROSS-REFERENCE TO RELATED APPLICATION

This application claims priority to Japanese Patent Application No. 2021-045477 filed on Mar. 19, 2021, the entire disclosure of which is incorporated herein by reference.

BACKGROUND ART

The present disclosure relates to an electric compressor.

As an example for conventional electric compressors, an electric compressor disclosed in Japanese Patent Application Publication No. 2020-122426 is known. The electric compressor disclosed in the above-described Patent Application Publication includes a motor, an inverter device, a housing including a partition wall, and a connection member. The inverter device includes a circuit board. The partition wall of the housing divides a motor chamber accommodating the motor from an inverter chamber accommodating the inverter device. The connection member includes a feedthrough terminal having a motor-side end disposed in the motor chamber and an inverter-side end disposed in the inverter chamber, and a busbar electrically connecting the circuit board with the inverter-side end. The circuit board is fixed to the inverter chamber with bolts.

The electric compressor disclosed in the above-described Patent Application Publication includes, on the circuit board, a plurality of fastening holes through which the busbars on a power supply side are fastened to the circuit board, and a plurality of fastening holes through which the circuit board is fastened to the housing. These fastening holes receive the bolts therethrough. Engineering designing of the circuit board includes tolerances of fastening positions of the bolts in a thickness direction of the circuit board. Therefore, fastening positions of a bolt may vary in the thickness direction of the circuit board with a difference within the tolerance. However, if variations in the fastening positions of the bolts adjacent to each other in the thickness direction of the circuit board with differences within the tolerances differ, the circuit board can be distorted when fastened with the bolts. When any of the busbar fastening holes and any of the housing fastening holes are located adjacent to each other on the circuit board, variations in the fastening positions in the thickness direction of the circuit board may differ between the above busbar fastening hole and the above housing fastening hole adjacent to each other, which is likely to cause a distortion of the circuit board at a position between the above busbar fastening hole and the above housing fastening hole. The circuit board distorted by fastening with the bolts may damage the circuit board itself or some soldered portions of electronic components mounted on the circuit board, which may result in a failure in electric conductivity. The distortion of the circuit board is likely to be greater as a distance between any of the busbar fastening holes and any of the housing fastening holes is shorter.

When any of the busbar fastening holes and any of the housing fastening holes are designed to be sufficiently distanced from each other on the circuit board, the distortion of the circuit board may be reduced. However, with a severe restriction on a layout of electric components on the circuit board or on an area of the circuit board on which the electronic components are to be mounted, a sufficient distance is unlikely to be provided between any of the busbar fastening holes and any of the housing fastening holes. In addition, in some cases, a noise filter for reducing noise components from electric current flowing through the busbars is mounted on the circuit board, and a ground line of the noise filter on the circuit board is electrically connected to the housing via the bolt inserted through one of the housing fastening holes. In this case, the noise filter is preferably mounted, on the circuit board, at a position close to the busbar fastening holes and some of the housing fastening holes in view of the noise reduction. For this reason, the busbar fastening holes and some of the housing fastening holes are generally provided close to each other on the circuit board. Also in view of downsizing of electric compressors, the busbar fastening holes and the housing fastening holes are preferably provided close to each other.

The present disclosure has been made in view of the above circumstances and is directed to providing an electric compressor capable of reducing a likelihood of a distortion of a circuit board caused by being fastened to a housing and a busbar, and of effectively reducing noise components on the circuit board.

SUMMARY

In accordance with an aspect of the present disclosure, there is provided an electric compressor including a compression portion configured to compress a refrigerant and discharge the compressed refrigerant, an electric motor configured to drive the compression portion, an inverter portion configured to control and drive the electric motor, and an inverter housing accommodating the inverter portion. The inverter portion includes a circuit board, a busbar fixed to the inverter housing and electrically connecting an external power supply to the circuit board, a noise reduction circuit mounted on the circuit board and configured to reduce a noise component contained in current flowing through the busbar, a first fastener fastening the circuit board to the inverter housing, and a second fastener fastening the busbar to the circuit board. The circuit board includes a first fastening hole through which the first fastener is inserted, a second fastening hole that is disposed adjacent to the first fastening hole and through which the second fastener is inserted, and a slit extending between the first fastening hole and the second fastening hole from a peripheral edge of the circuit board. The first fastener electrically connects the circuit board as a ground of the noise reduction circuit to the inverter housing.

Other aspects and advantages of the disclosure will become apparent from the following description, taken in conjunction with the accompanying drawings, illustrating by way of example the principles of the disclosure.

BRIEF DESCRIPTION OF THE DRAWINGS

The disclosure, together with objects and advantages thereof, may best be understood by reference to the following description of the embodiments together with the accompanying drawings in which.

DETAILED DESCRIPTION OF THE EMBODIMENTS

The following will describe an electric compressor according to an embodiment of the present disclosure with reference to the accompanying drawings. The electric compressor according to the embodiment is an electric compressor to be mounted on a vehicle as part of an air conditioning system for the vehicle.

Figure 1:
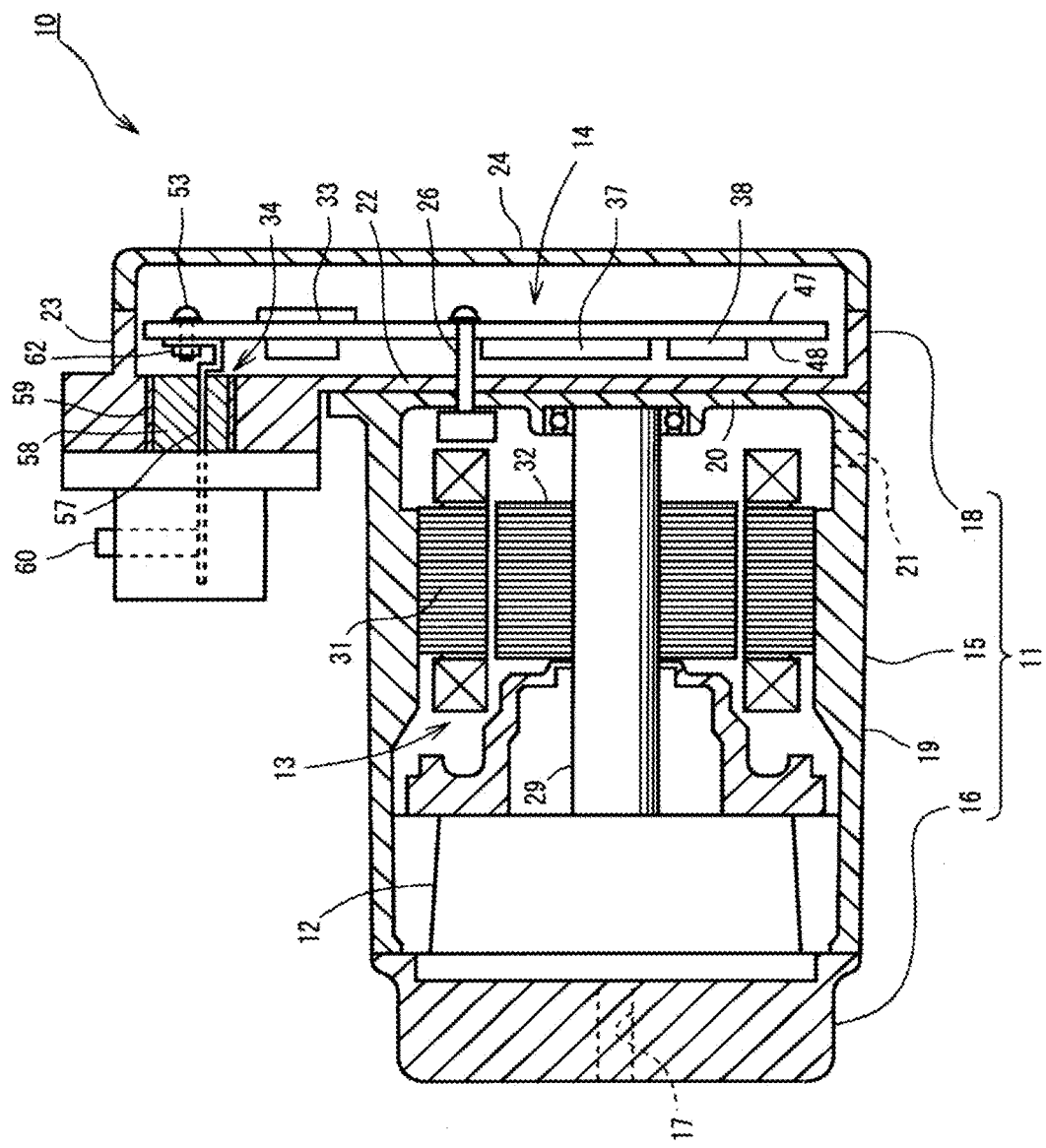
FIG. 1 is a schematic longitudinal section view of an electric compressor according to an embodiment of the present disclosure.

As illustrated in FIG. 1, an electric compressor 10 includes a housing 11, a compression portion 12, an electric motor 13, and an inverter portion 14. The housing 11 includes a motor housing 15 that accommodates the compression portion 12 and the electric motor 13, a discharge housing 16 that is joined to the motor housing 15 and has an outlet port 17, and an inverter housing 18 that accommodates the inverter portion 14. The motor housing 15, the discharge housing 16, and the inverter housing 18 are made of an aluminum alloy.

The motor housing 15 has a peripheral wall 19 having a cylindrical shape, and a partition wall 20 that closes one end of the peripheral wall 19. The peripheral wall 19 and the partition wall 20 define a space accommodating the compression portion 12 and the electric motor 13. The partition wall 20 is joined to the inverter housing 18. The peripheral wall 19 has an inlet port 21 at a position close to the partition wall 20. The inlet port 21 takes in a refrigerant. The discharge housing 16 is joined to the other end of the peripheral wall 19. The refrigerant taken in from the inlet port 21 is sucked into the compression portion 12 to be compressed in the compression portion 12. The compressed refrigerant is discharged from the outlet port 17.

Figure 2:
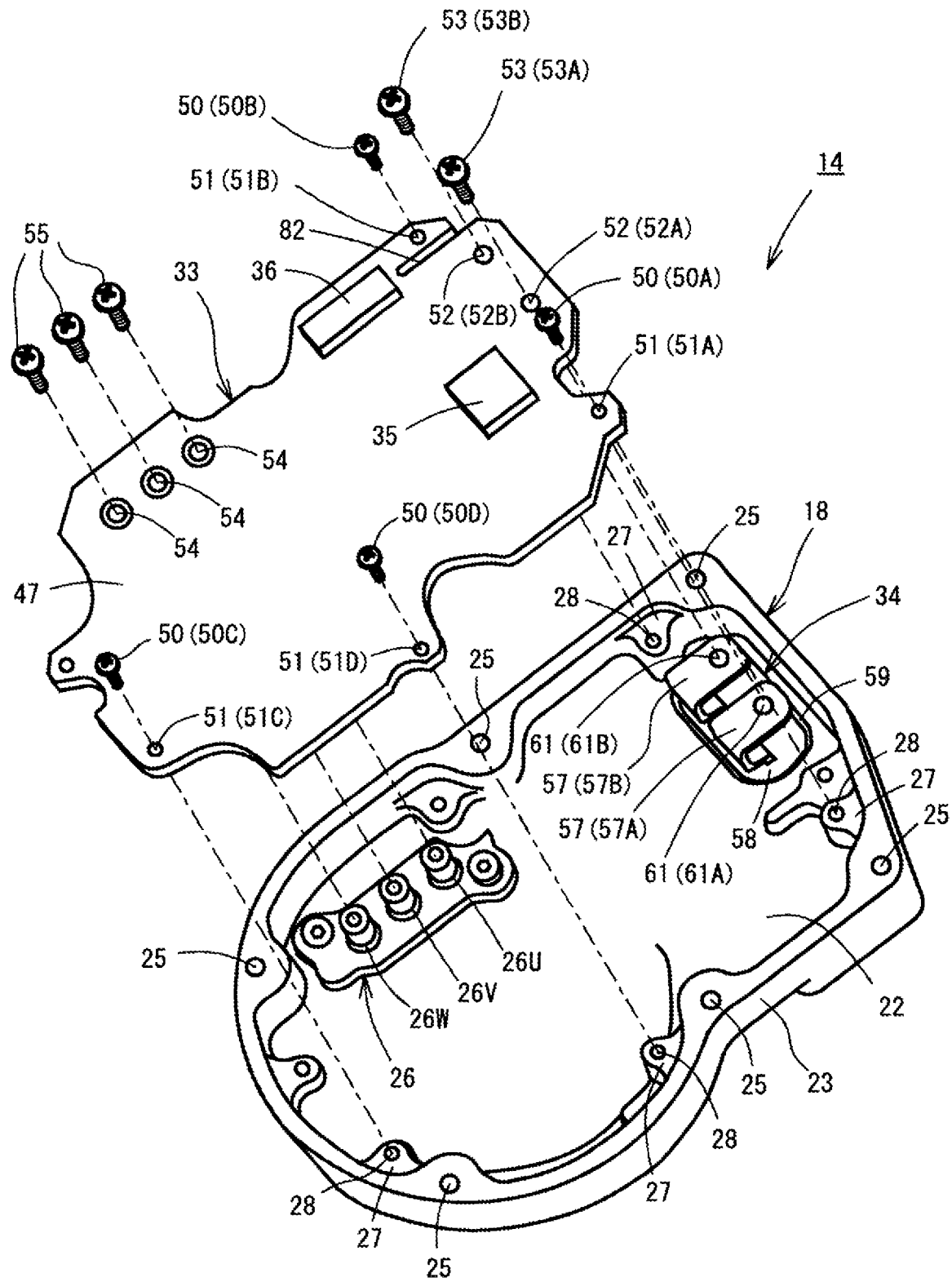
FIG. 2 is an exploded perspective view of key portions of the electric compressor according to the embodiment of the present disclosure.

The inverter housing 18 has a bottom wall 22 joined to the partition wall 20 of the motor housing 15, and an outer wall 23 protruding from the bottom wall 22 in one direction and extending along an outer peripheral edge of the bottom wall 22. The bottom wall 22 and the outer wall 23 of the inverter housing 18 define a space accommodating the inverter portion 14. An inverter cover 24 is joined to an end surface of the outer wall 23 so as to close an opening of the inverter housing 18. As illustrated in FIG. 2, the end surface of the outer wall 23 has a plurality of screw holes 25. The screw holes 25 receive fastening bolts screwed therein so as to join the inverter cover 24 to the end surface of the outer wall 23.

The bottom wall 22 is provided with a three-phase terminal portion 26 configured to supply three-phase alternating current power from the inverter portion 14 to the electric motor 13. The three-phase terminal portion 26 includes a U-phase terminal 26U, a V-phase terminal 26V, and a W-phase terminal 26W each having a rod shape. The three-phase terminal portion 26 extends through the partition wall 20 and the bottom wall 22 to face the electric motor 13. As illustrated in FIG. 2, the bottom wall 22 is formed with a plurality of seating portions 27 on an inner side of the outer wall 23. The seating portions 27 are used for fixing a circuit board 33 that will be described later. Each of the seating portions 27 has a screw hole 28 on an end surface thereof.

The compression portion 12 compresses the refrigerant taken in from the inlet port 21. The refrigerant taken in from the inlet port 21 is sucked into the compression portion 12 to be compressed in the compression portion 12. The compressed refrigerant is discharged from the outlet port 17. The compression portion 12 may be, for example, a scroll type. The compression portion 12 may be other than the scroll type such as a piston type or a vane type. The compression portion 12 is connected to a rotary shaft 29 rotatably supported by the motor housing 15, and is driven by rotation of the electric motor 13. One end of the rotary shaft 29 is rotatably supported by the partition wall 20, and the other end of the rotary shaft 29 is connected to the compression portion 12.

The electric motor 13 drives the compression portion 12. The electric motor 13 includes a stator 31 fixed to an inner peripheral surface of the peripheral wall 19 of the motor housing 15, and a rotor 32 fixed to the rotary shaft 29. The electric motor 13 rotates the rotary shaft 29 to drive the compression portion 12. The electric motor 13 receives a supply of the three-phase alternating current power from the inverter portion 14, and is controlled and driven by the inverter portion 14.

Figure 3:
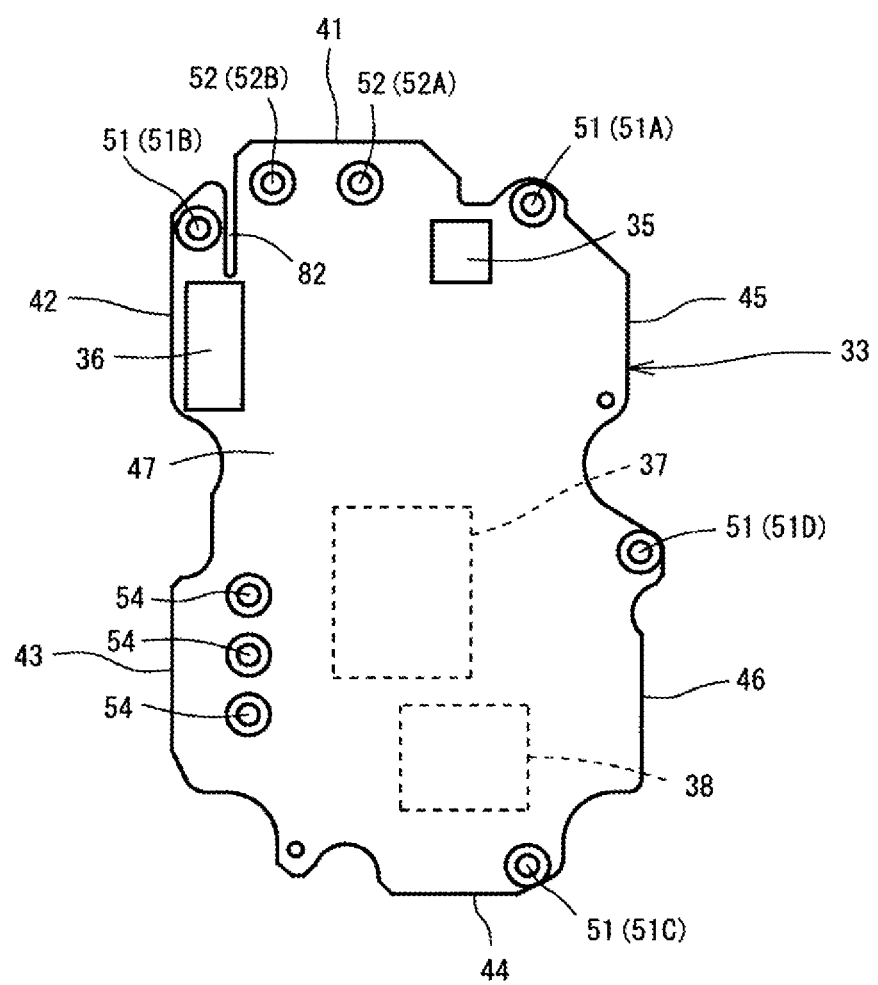
FIG. 3 is a front view of a circuit board of the electric compressor according to the embodiment of the present disclosure.

The inverter portion 14 is accommodated in the inverter housing 18. As illustrated in FIG. 2, the inverter portion 14 includes the circuit board 33, a power supply assembly 34, a first filter circuit 35, and a second filter circuit 36. As illustrated in FIG. 3, the inverter portion 14 further includes a drive circuit 37 and a control circuit 38. The circuit board 33 is a multilayer board having multilayer wiring patterns, and has a peripheral edge extending substantially along the outer wall 23 of the inverter housing 18. Electronic components such as the first filter circuit 35 and the second filter circuit 36 are soldered onto the circuit board 33.

The peripheral edge of the circuit board 33 includes a first peripheral edge 41 located close to the power supply assembly 34, a second peripheral edge 42 located close to the second filter circuit 36, and a third peripheral edge 43 located along a line extending from the second peripheral edge 42 and close to the three-phase terminal portion 26. The peripheral edge of the circuit board 33 further includes a fourth peripheral edge 44 located on a side opposite to the first peripheral edge 41 across the circuit board 33, a fifth peripheral edge 45 located on a side opposite to the second peripheral edge 42 across the circuit board 33, and a sixth peripheral edge 46 located on a side opposite to the third peripheral edge 43 across the circuit board 33. The first peripheral edge 41 to the sixth peripheral edge 46 each have substantially linear shapes. The rest portions of the peripheral edge of the circuit board 33 other than the first peripheral edge 41 to the sixth peripheral edge 46 each have a curved shape. The circuit board 33 includes a first surface 47 and a second surface 48. The first surface 47 faces the inverter cover 24. The second surface 48 is on a side opposite to the first surface 47 and faces the bottom wall 22.

The circuit board 33 includes a plurality of first insertion holes 51 at positions close to the peripheral edge of the circuit board 33. The first insertion holes 51 correspond to a first fastening hole. The first insertion holes 51 are located on the circuit board 33 at positions corresponding to positions of the screw holes 28 of the seating portions 27. The first insertion holes 51 are through holes through which the associated bolts 50 are inserted. The circuit board 33 is fixed to the inverter housing 18 by screwing the bolts 50 inserted through the first insertion holes 51 into the associated screw holes 28 of the inverter housing 18. The bolts 50 correspond to a first fastener for fixing the circuit board 33 to the inverter housing 18. A flat washer or a spring washer may be used for fastening the bolt 50. In a case where the plurality of first insertion holes 51 needs to be distinguished, one of the first insertion holes 51 located at a position between the first peripheral edge 41 and the fifth peripheral edge 45 at a position close to the peripheral edge of the circuit board 33 is referred to as a first insertion hole 51A, another one of the first insertion holes 51 located at a position close to the second peripheral edge 42 is referred to as a first insertion hole 51B, yet another one of the first insertion holes 51 located at a position close to the fourth peripheral edge 44 is referred to as a first insertion hole 51C, and the rest of the first insertion holes 51 located between the fifth peripheral edge 45 and the sixth peripheral edge 46 at a position close to the peripheral edge of the circuit board 33 is referred to as a first insertion hole 51D. In a case where the bolts 50 need to be distinguished, the bolts associated with the first insertion hole 51A to the first insertion hole 51D are referred to as a bolt 50A to a bolt 50D, respectively.

The circuit board 33 includes a pair of second insertion holes 52 used for connecting to the power supply assembly 34. The pair of second insertion holes 52 is located at a position close to the first peripheral edge 41, corresponding to a position of the power supply assembly 34. The second insertion holes 52 correspond to a second fastening hole. Each of the pair of second insertion holes 52 receives each of a pair of bolts 53 inserted therethrough for connecting the circuit board 33 and the power supply assembly 34. In a case where the pair of second insertion holes 52 needs to be distinguished, one of the pair of second insertion holes 52 located at a position close to the first insertion hole 51A is referred to as a second insertion hole 52A whereas the other of the pair of second insertion holes 52 located at a position close to the first insertion hole 51B is referred to a second insertion hole 52B. Similarly, in a case where the bolts 53 need to be distinguished, one of the bolts 53 that is inserted through the second insertion hole 52A is referred to as a bolt 53A whereas the other of the bolts 53 that is inserted through the second insertion hole 52B is referred to as a bolt 53B. The bolts 53 are used for fixing a pair of busbars 57, which will be described later, to the circuit board 33. The bolts 53 correspond to a second fastener.

The circuit board 33 includes three insertion holes 54 through which the U-phase terminal 26U, the V-phase terminal 26V, and the W-phase terminal 26W of the three-phase terminal portion 26 are inserted. The three insertion holes 54 are located at positions close to the third peripheral edge 43, corresponding to a position of the three-phase terminal portion 26. The U-phase terminal 26U, the V-phase terminal 26V, and the W-phase terminal 26W that are inserted through the insertion holes 54 are fastened with the bolts 55 so that the three-phase terminal portion 26 is electrically connected to the circuit board 33.

The power supply assembly 34 will now be described below. The power supply assembly 34 is supported by the inverter housing 18. The power supply assembly 34 includes the pair of busbars 57, a resin portion 58, and a grommet 59. Each of the pair of busbars 57 is an electrically conductive member having a plate shape and configured to supply power to the circuit board 33 through a power supply connector unit. The busbars 57 are capable of supplying a large amount of electric current. The busbars 57 electrically connect the circuit board 33 with a battery as an external power supply. The pair of busbars 57 is supported by the resin portion 58 that penetrates the partition wall 20 and the bottom wall 22. The busbars 57 and the housing 11 are insulated by the grommet 59 made of a rubber material that covers the resin portion 58 and portions surrounding the resin portion 58. In other words, the resin portion 58 and the grommet 59 are interposed between the busbars 57 and the inverter housing 18. The resin portion 58 and the grommet 59 correspond to an insulation member. In a case where the pair of busbars 57 needs to be distinguished, one of the pair of busbars 57 associated with the second insertion hole 52A is referred to as a busbar 57A whereas the other of the pair of busbars 57 associated with the second insertion hole 52B is referred to as a busbar 57B.

One end of each of the busbars 57 on a side close to the circuit board 33 protrudes from the resin portion 58 and is bended so as to be in surface contact with the pattern on the circuit board 33 and elastically deformable in a thickness direction of the circuit board 33. The other end of each of the busbars 57 on a side opposite to the side close to the circuit board 33 protrudes from the resin portion 58 and is connected to a rod terminal 60 that is connected to the battery as the external power supply. As illustrated in FIG. 2, the one end of each of the busbars 57 on the side in surface contact with the pattern of the circuit board 33 has each of insertion holes 61. Each of the bolts 53 is inserted through the associated insertion hole 61. Each of the bolts 53 inserted through the associated second insertion hole 52 and the associated insertion hole 61 of the associated busbar 57 is screwed into an associated nut 62 to be fastened together so that the pair of busbars 57 are fastened and electrically connected to the circuit board 33. In a case where the insertion holes 61 need to be distinguished, one of the insertion holes 61 through which the bolt 53A is inserted is referred to as an insertion hole 61A whereas the other of the insertion holes 61 through which the bolt 53B is inserted is referred to as an insertion hole 61B. The nuts 62, as well as the bolts 53, correspond to the second fastener. A flat washer or a spring washer may be used for fastening the bolt 53 and the nut 62.

The first filter circuit 35 and the second filter circuit 36 will now be described below. As illustrated in FIG. 3, the first filter circuit 35 and the second filter circuit 36 are disposed on the first surface 47 of the circuit board 33. The first filter circuit 35 is located at a position close to the first insertion hole 51A and the second insertion hole 52A on the first surface 47. The second filter circuit 36 is located at a position close to the second peripheral edge 42 and the first insertion hole 51B. The first filter circuit 35 and the second filter circuit 36 form part of a noise reduction circuit 63 illustrated in FIG. 4. For the sake of simplification, the first filter circuit 35 and the second filter circuit 36 are illustrated as rectangles in FIG. 3.

The drive circuit 37 and the control circuit 38 will now be described below. The drive circuit 37 and the control circuit 38 are disposed on the second surface 48 of the circuit board 33. The drive circuit 37 is a circuit configured to convert direct current power into alternating current power to supply the alternating current power to the electric motor 13. The drive circuit 37 includes a plurality of switching elements for converting the direct current power into the alternating current power. The control circuit 38 is a circuit configured to control the drive circuit 37. The control circuit 38 includes a microprocessor configured to operate according to a program. The microprocessor includes a central processing unit configured to perform arithmetic operations and a memory configured to store the program. The control circuit 38 is configured to control the drive circuit 37 in response to a command from an electronic control unit of the air conditioning system. For the sake of simplification, the drive circuit 37 and the control circuit 38 are illustrated as rectangles in FIG. 3.

Figure 4:
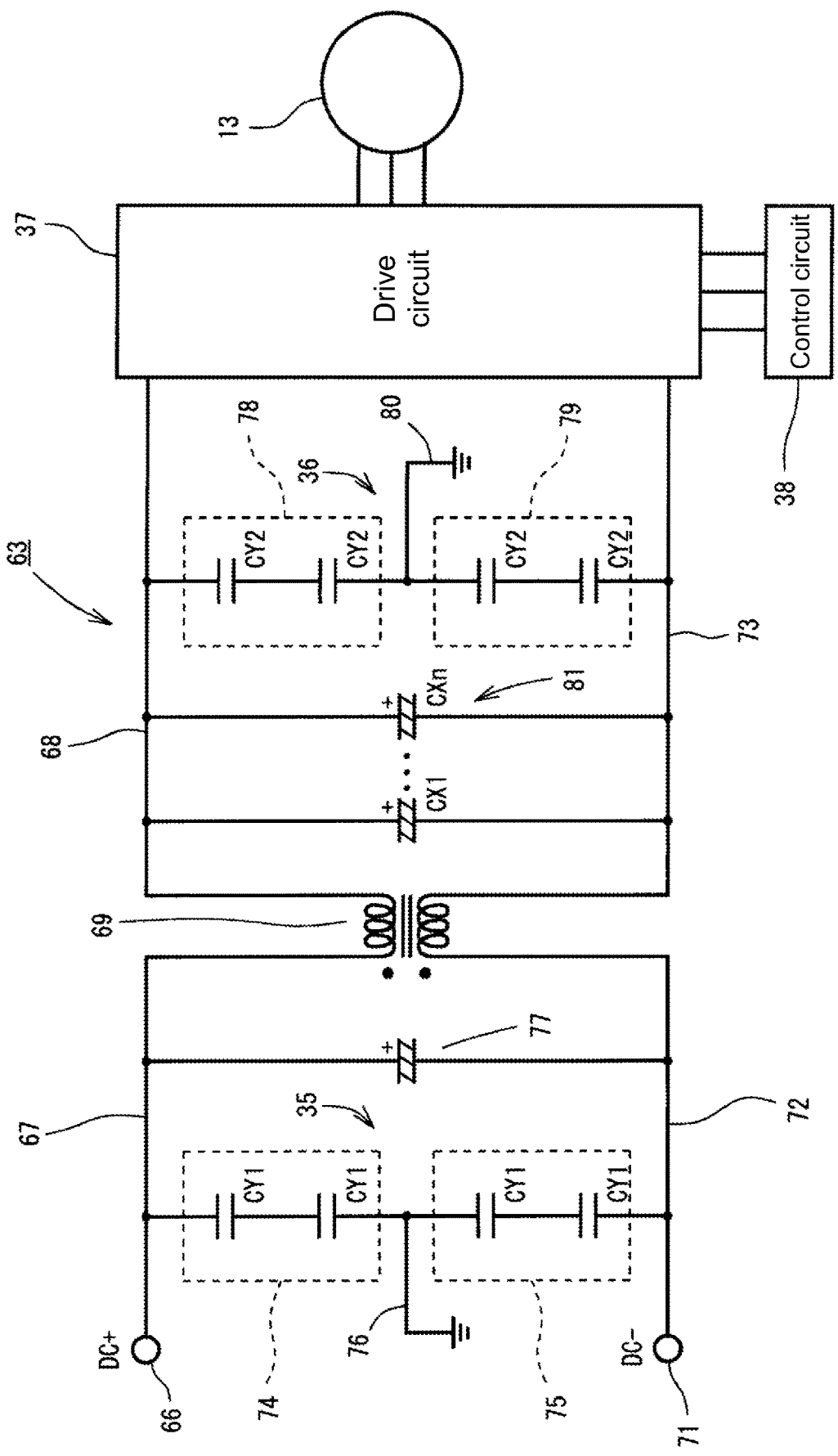
FIG. 4 is an explanatory view illustrating an electrical configuration of the electric compressor according to the embodiment of the present disclosure.

An electrical configuration of the inverter portion 14 will now be described below. As illustrated in FIG. 4, the inverter portion 14 includes, in addition to the drive circuit 37 and the control circuit 38, the noise reduction circuit 63 mounted on the circuit board 33 and configured to reduce noise components contained in the direct current power flowing through the busbars 57. In the noise reduction circuit 63, a positive input line 67 is connected to a positive input terminal 66. The positive input line 67 on an output side is connected to a positive output line 68 through a common coil 69. The positive output line 68 on the output side is connected to a positive input terminal of the drive circuit 37. The common coil 69 is configured to suppress a high frequency noise to be transmitted to the drive circuit 37.

In the noise reduction circuit 63, a negative input line 72 is connected to a negative input terminal 71. The negative input line 72 on the output side is connected to a negative output line 73 through the common coil 69. The negative output line 73 on the output side is connected to a negative input terminal of the drive circuit 37.

The positive input line 67 and the negative input line 72 are connected by a line connecting two Y-capacitor groups 74 and 75 in series. Each of the Y-capacitor groups 74 and 75 includes two Y-capacitors CY1 connected in series therein. The Y-capacitor groups 74 and 75 form the first filter circuit 35. A ground line 76 is connected to the line connecting the two Y-capacitor groups 74 and 75 in series, at a position between the two Y-capacitor groups 74 and 75. The ground line 76 is electrically connected to the housing 11 with the bolt 50A located closest to the first filter circuit 35 on the circuit board 33. The positive input line 67 and the negative input line 72 are connected through a smoothing capacitor 77.

The positive output line 68 and the negative output line 73 are connected through two Y-capacitor groups 78 and 79 connected in series. Each of the Y-capacitor groups 78 and 79 includes two Y-capacitors CY2 connected in series. The Y-capacitor groups 78 and 79 form the second filter circuit 36. A ground line 80 is connected to the line connecting the two Y-capacitor groups 78 and 79 in series, at a position between the two Y-capacitor groups 78 and 79. The ground line 80 is electrically connected to the housing 11 with the bolt 50B located closest to the second filter circuit 36 on the circuit board 33. An X-capacitor group 81 is connected to the positive output line 68 and the negative output line 73. The X-capacitor group 81 includes n-units of X-capacitors CX1 to CXn connected in parallel.

Figure 5:
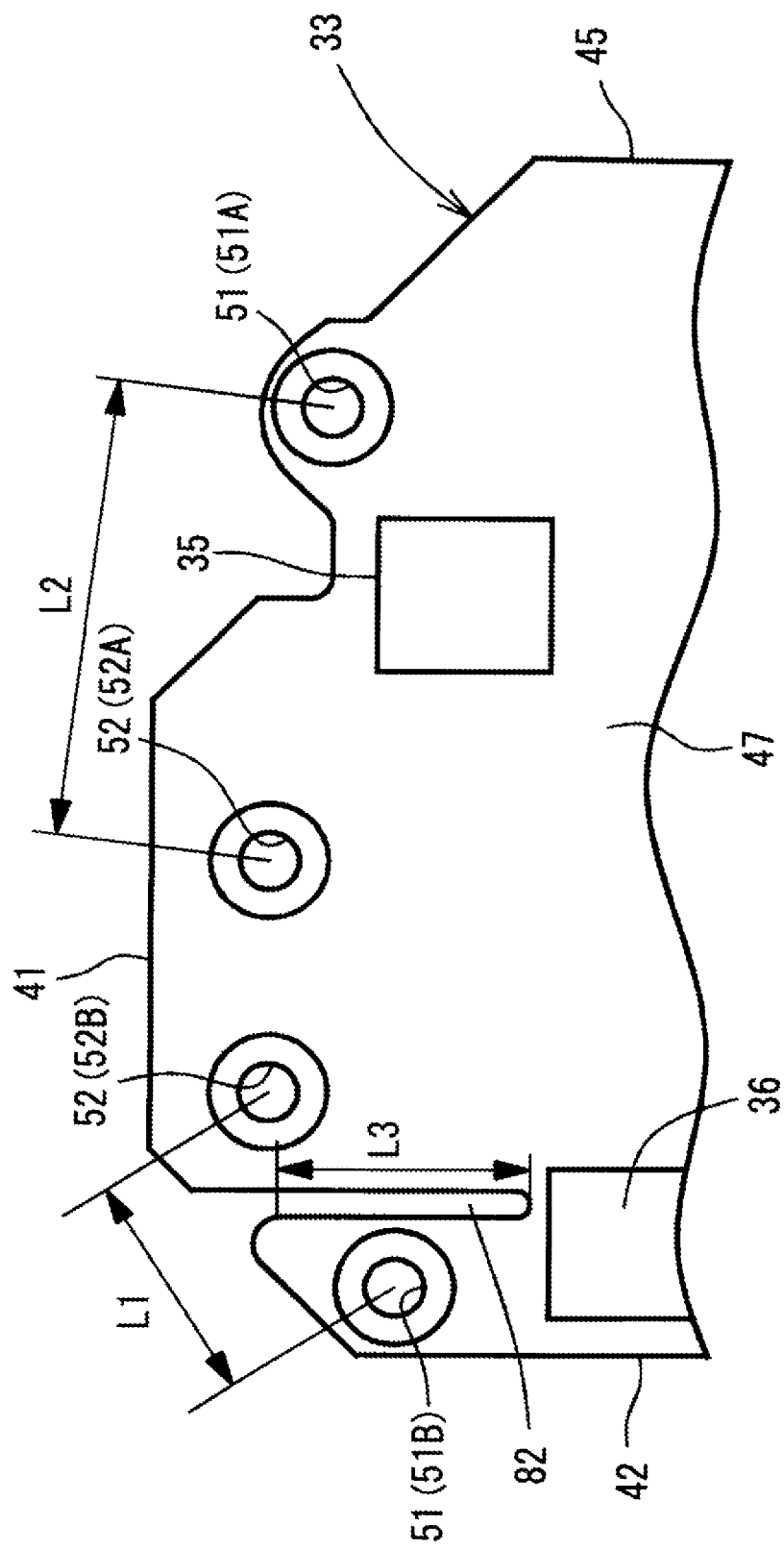
FIG. 5 is a front view of key portions of the circuit board of the electric compressor according to the embodiment of the present disclosure.

As illustrated in FIG. 5, the circuit board 33 has a slit 82 linearly extending from a part of the peripheral edge between the first peripheral edge 41 and the second peripheral edge 42, in parallel with the second peripheral edge 42 so as to pass between the first insertion hole 51B and the second insertion hole 52B that is closest to the first insertion hole 51B. The slit 82 is formed so as not to interfere with the patterns and the electronic components on the circuit board 33. A distance L1 between a center of the first insertion hole 51B and a center of the second insertion hole 52B is shorter than a distance L2 between a center of the first insertion hole 51A and a center of the second insertion hole 52A because the ground line 80 is desirably located physically close to the busbars 57.

With the busbars 57 fixed to the circuit board 33 that is fixed to the inverter housing 18, variations in positions at the first insertion hole 51B and at the second insertion hole 52B of the circuit board 33 in the thickness direction may differ within tolerances. In particular, the busbars 57 of the power supply assembly 34 are supported by the inverter housing 18 via the resin portion 58 and the grommet 59. In this case, the variation in the position at the second insertion hole 52B of the circuit board 33 in the thickness direction within the tolerance is likely to be greater than the variations in the positions at the first insertion holes 51 of the circuit board 33 in the thickness direction within the tolerance since the variation in the position at the second insertion hole 52B within the tolerance includes variations in positions of other components such as the resin portion 58 and the grommet 59 in the thickness direction of the circuit board 33 within the tolerances. As a result, the position of the circuit board 33 around the bolts 53A and 53B is varied upper or lower in the thickness direction within the tolerance than a position of the circuit board 33 around the bolt 50B. The difference in the variation in the position of the circuit board 33 in the thickness direction within the tolerance between the portion of the circuit board 33 around the first insertion hole 51B and the portion of the circuit board 33 around the second insertion hole 52B is likely to cause a distortion of the circuit board 33 at a portion between the first insertion hole 51B and the second insertion hole 52B. However, the slit 82 located between the first insertion hole 51B and the second insertion hole 52B reduces the likelihood of the distortion of the circuit board 33 caused by the difference in the variation in the position of the circuit board 33 in the thickness direction.

The slit 82 sufficiently secures a creepage distance between the bolt 50B at the first insertion hole 51B and the bolt 53B at the second insertion hole 52B. By securing the creepage distance, insulation between the bolt 50B at the first insertion hole 51B and the bolt 53B at the second insertion hole 52B is enhanced with respect to a case without the slit 82. An increase in a length L3 of the slit 82 increases a reduction in distortion of the circuit board 33 as well as the creepage distance between the bolt 50B at the first insertion hole 51B and the bolt 53B at the second insertion hole 52B. The length L3 of the slit 82 extending from the peripheral edge of the circuit board 33 is allowable to be at least equal to or greater than the distance L1 between the center of the first insertion hole 51B and the center of the second insertion hole 52B. In a case where a large amount of electric current flows through the circuit board 33, in particular, the length L3 is desirably greater. An innermost end of the slit 82 has an arc-shaped surface to reduce a stress concentration since the arc-shaped surface is likely to release a concentrated stress. The slit 82 is designed so that the stress released form the slit 82 by the arc-shaped surface does not reach the patterns nor the electronic components on the circuit board 33.

The following will describe operational effects of the electric compressor 10 according to the embodiment of the present disclosure. To drive the electric compressor 10, the direct current power from a power supply such as a battery is supplied to the circuit board 33 of the inverter portion 14 through the power supply assembly 34. The noise components contained in the direct current flowing through the circuit board 33 is reduced by the noise reduction circuit 63 including the first filter circuit 35 and the second filter circuit 36. The noise components are effectively absorbed into the housing 11 through, for example, the ground lines 76 and 80. The direct current power after the noise components is reduced is converted into the alternating current power by the drive circuit 37 and supplied to the electric motor 13. The drive circuit 37 controls the alternating current power supplied to the electric motor 13 in response to the command from the control circuit 38.

The circuit board 33 is fixed to the inverter housing 18 by fastening with the bolts 50 that are inserted through the respective first insertion holes 51. The busbars 57 are fastened with the bolts 53 inserted through the second insertion holes 52 and the nuts 62, respectively, to be fixed to the circuit board 33. Fastened with the bolt 50B through the first insertion hole 51B, the circuit board 33 is electrically connected to the inverter housing 18 as the ground of the noise reduction circuit 63. The variation in the position of the circuit board 33 at the first insertion hole 51B in the thickness direction within the tolerance is different from the variation in the position of the circuit board 33 at the second insertion hole 52B in the thickness direction within the tolerance, which is likely to cause the position of the circuit board 33 around the bolt 53B to be varied upper or lower in the thickness direction than the position of the circuit board 33 around the bolt 50B. However, the slit 82 of the circuit board 33 allows the circuit board 33 to be elastically deformable like a spring so as to reduce the distortion of the circuit board 33 at the portion between the first insertion hole 51B and the second insertion hole 52B caused by the variation in the position of the circuit board 33 to be upper or lower in the thickness direction.

The electric compressor 10 according to the embodiment offers the following advantageous effects.

(1) The circuit board 33 includes the slit 82 that is disposed at the position between the first insertion hole 51B and the second insertion hole 52B, extending from the peripheral edge of the circuit board 33. Even when the first insertion hole 51B and the second insertion hole 52B are located close to each other, the slit 82 of the circuit board 33 reduces the distortion of the circuit board 33 at the portion between the first insertion hole 51B and the second insertion hole 52B, and thus, reduces the distortion caused by fastening the circuit board 33 with bolts. This results in reducing a likeliness of damaging the circuit board 33 itself or some soldered portions of electronic components mounted on the circuit board 33, which reduces a failure in electric conductivity. The slit 82 also allows the first insertion hole 51B and the second insertion hole 52B to be brought closer to each other, and thus, the noise components reduced by the noise reduction circuit 63 on the circuit board 33 are effectively absorbed through the ground line 80 via the bolt 50B located in the vicinity of the busbars 57 into the housing 11. In other words, the slit 82 effectively reduces both the distortion of the circuit board 33 and the noise components.

(2) Since the slit 82 has the length L3 that is equal to or greater than the distance L1 between the first insertion hole 51B and the second insertion hole 52B of the circuit board 33, the distortion of the circuit board 33 at the portion between the first insertion hole 51B and the second insertion hole 52B is suitably reduced.

(3) The resin portion 58 and the grommet 59 are interposed between the busbars 57 and the inverter housing 18. The resin portion 58 and the grommet 59 may increase the variation in the positions of the circuit board 33 at the second insertion holes 52 within the tolerance. However, the slit 82 effectively reduces the distortion of the circuit board 33 caused by fastening the bolt.

(4) The slit 82 allows the noise components reduced by the second filter circuit 36 of the noise reduction circuit 63 to be effectively absorbed into the housing 11 through the ground line 80 via the bolt 50B located in the vicinity of the slit 82.

(5) Since the slit 82 allows the first insertion hole 51B and the second insertion hole 52B to be close to each other, vibration resistance of the electric compressor 10 is enhanced and also the electric compressor 10 is downsized, as compared to a case where the first insertion hole 51B and the second insertion hole 52B are distanced.

The scope of the present disclosure is not limited to the above-described embodiment, but is intended to include various modifications as far as they are equivalent in essence to the scope of the disclosure. For example, the embodiment of the present disclosure may be modified as follows.

In the above-described embodiment, the noise reduction circuit includes the common coil, the X-capacitors, and the Y-capacitors, but the configuration of the noise reduction circuit is not limited to this. The noise reduction circuit may include, for example, a normal coil in addition to the common coil. The number of the Y-capacitors is not limited to a particular number.

In the above-described embodiment, the length of the slit is equal to or greater than the distance between the center of the first fastening hole and the center of the second fastening hole, but the length of the slit is not limited to this. The length of the slit may be less than the distance between the center of the first fastening hole and the center of the second fastening hole.

In the above-described embodiment, the slit extends in parallel with part of the peripheral edge of the circuit board. However, the slit is not limited to this. The slit may extend regardless of the direction of the peripheral edge of the circuit board. The slit does not need to linearly extend, but may extend in a curve. A width of the slit does not need to be constant, but may gradually vary.

In the above-described embodiment, the resin portion and the grommet that support the busbars correspond to the insulation member as an example, but the insulation member is not limited to this. The insulation member may be, for example, a single member or may be three or more members.

In the above-described embodiment, the motor housing 15 and the inverter housing 18 are separate components. However, the motor housing 15 and the inverter housing 18 may be integrally formed.

What is claimed is:

1. An electric compressor to be mounted on a vehicle configured to compress a refrigerant and discharge the compressed refrigerant, comprising:

An electric motor configured to drive the electric compressor, an inverter portion configured to control and drive the electric motor; and an inverter housing accommodating the inverter portion, the inverter portion including:
a circuit board;
a busbar fixed to the inverter housing and electrically connecting an external power supply to the circuit board;
a noise reduction circuit mounted on the circuit board and configured to reduce a noise component contained in current flowing through the busbar;
a first fastener fastening the circuit board to the inverter housing; and
a second fastener fastening the busbar to the circuit board, wherein the circuit board includes:
a first fastening hole through which the first fastener is inserted;
a second fastening hole through which the second fastener is inserted; and
a slit extending between the first fastening hole and the second fastening hole from a peripheral edge of the circuit board so as to have a length that is equal to or greater than a distance between the first fastening hole and the second fastening hole, wherein the slit extends from the peripheral edge in a direction toward the noise reduction circuit, a distance between the first fastening hole and the noise reduction circuit is shorter than a distance between the second fastening hole and the noise reduction circuit, and the first fastener electrically connects the circuit board as a ground of the noise reduction circuit to the inverter housing.

2. The electric compressor according to claim 1, wherein an insulation member is interposed between the busbar and the inverter housing.

3. The electric compressor according to claim 1, wherein the external power supply is a battery.

4. The electric compressor according to claim 3, wherein the circuit board has a first surface and a second surface, the noise reduction circuit is mounted on the first surface of the circuit board and includes a first filter circuit and a second filter circuit, and direct current power from the battery is supplied to the circuit board of the inverter portion, and noise components contained in the direct current flowing through the busbar and the circuit board is reduced by the noise reduction circuit and absorbed into the inverter housing by the first fastener.

* * * * *